(12) United States Patent
Jordan

(10) Patent No.: US 6,629,614 B2
(45) Date of Patent: Oct. 7, 2003

(54) MOUNTING FOR TELECOMMUNICATIONS EQUIPMENT

(75) Inventor: Alan Jordan, Ballyclare (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/846,900

(22) Filed: May 1, 2001

(65) Prior Publication Data

US 2002/0162808 A1 Nov. 7, 2002

(51) Int. Cl.[7] ................................................. A47F 5/00
(52) U.S. Cl. ..................... 211/26; 312/223.1; 312/265.1
(58) Field of Search ........................ 211/26, 189, 182; 312/265.1, 265.2, 265.3, 265.4, 265.5, 265.6, 223.1; 248/609, 638, 615, 635; 52/167.1, 167.7, 167.8; 361/829

(56) References Cited

U.S. PATENT DOCUMENTS

| | | | | |
|---|---|---|---|---|
| 5,004,107 A | * | 4/1991 | Sevier et al. | .................. 211/26 |
| 5,289,348 A | * | 2/1994 | Miller | |
| 5,335,893 A | * | 8/1994 | Opp | ........................... 248/635 |
| 5,460,348 A | * | 10/1995 | Cox | ........................... 248/638 |
| 5,975,315 A | * | 11/1999 | Jordan | .......................... 211/26 |
| 6,155,660 A | * | 12/2000 | Nicolai | ................ 312/265.1 X |
| 6,179,133 B1 | * | 1/2001 | Reece | ......................... 211/26 |
| 6,234,445 B1 | * | 5/2001 | Yoon | ........................... 248/638 |
| 6,301,837 B1 | * | 10/2001 | Ray | ......................... 211/26 X |

* cited by examiner

Primary Examiner—Robert W. Gibson, Jr.
(74) Attorney, Agent, or Firm—Barnes & Thornburg

(57) ABSTRACT

A mounting bracket for mounting an equipment housing such as a telecommunications equipment shelf to a rack, the mounting bracket comprising a bracket body for rigid attachment to the housing, a fastener for rigid attachment to the rack, and a damping member coupling the fastener to the bracket body. The damping member isolates the equipment within the housing from the rack such that earthquake vibration resistance is improved. The damping member is preferably an elastomeric material such as very high density silicone. It is preferably configured to preferentially absorb vibrations at resonant frequencies of the rack structure.

31 Claims, 16 Drawing Sheets

MOUNTING FOR TELECOMMUNICATIONS EQUIPMENT

FIELD OF THE INVENTION

The present invention relates to systems for mounting equipment on racks, and in particular to the mounting of telecommunications equipment shelves or sub-racks on rack systems.

BACKGROUND OF THE INVENTION

Telecommunications equipment such as switching circuits on cards are typically held in parallel slots within shelves or sub-racks. These shelves are in turn mounted within rack structures by mounting bolts or similar connectors.

My earlier U.S. Pat. No. 5,975,315 (the entire contents of which are incorporated herein by reference) describes an equipment rack of this type for holding telecommunications equipment within shelves mounted in the equipment rack.

The rack of U.S. Pat. No. 5,975,315 comprises a base member, a pair of parallel side members extending vertically upwards from the base member and a top member coupling the free ends of the side members. Means are provided for securing the base member to a floor (or other support surface).

Rack systems such as those of U.S. Pat. No. 5,975,315 are required to conform to industry standards such as the standard "ETS 300-Pt3: Engineering Requirements for Miscellaneous Racks & Cabinets" set by the European Telecommunications Standards Institute (ETSI), or the "23 inch" standard ("ANSI/EIA-310-D-1992: Cabinets, Racks, Panels, & Associated Equipment" set by the American National Standards Institute and the Electronic Industries Association). In an ETSI rack conforming to ETS 300 a plurality of mounting holes are provided down the front surfaces of the two side members.

The shelves are provided with mounting means such as a pair of L-shaped brackets affixed to the front part of the sidewalls of the shelves and extending outwards from the front surface of the shelves on either side. In this way, when a shelf is inserted into the rack between the side members, a portion of the L shaped bracket overlaps the mounting holes of the respective side member, allowing a bolt or screw to affix the bracket (and thus the shelf) to the rack.

The L-shaped brackets serve a further purpose in earthing the shelves and the equipment in the shelves, by making a good electrical connection between the shelf housing and the rack structure which is itself earthed.

In a rack conforming to the 23 inch EIA standard the mounting method is similar but the support is located more deeply within the rack, i.e. at a point between the front and back of the shelves.

The susceptibility of a geographical location to severe earthquake damage is classified, with any given location being rated from Zone 1 to Zone 4 (with Zone 4 denoting the greatest risk). In Zone 4 locations, telecommunications equipment contained in standard rack systems is likely to suffer vibration- or shock-induced damage due to the potential severity of an earthquake in such a zone.

The rack of U.S. Pat. No. 5,975,315 addresses earthquake induced vibrations by providing a number of bolts for mounting the base member to the floor. When these bolts are overtightened or overtorqued (as they are designed to be), the base member is pre-stressed, and this stress is transmitted to the side members. This has the effect of increasing the frequency response of the rack. Since earthquake induced vibrations are typically low frequency vibrations (e.g. most of the energy is at frequencies of not more than about 10 Hz), many of the effects of earthquake induced vibration can be greatly reduced by this method.

Other methods of earthquake proofing telecommunications equipment racks have been proposed such as in U.S. Pat. No. 5,004,107, which discloses a rack having a heavily reinforced base portion which braces the rack against applied forces. The disadvantage of this is that the box-like base portion is bulky and limits the volume of equipment which can be housed in the rack. Since racks will typically have standard outer dimensions (e.g. 2200 mm×600 mm×300 mm for an ETSI rack), a reduction in available volume will result in more racks being needed to house the same amount of equipment, which is a severe problem in installations where space is at a premium.

In order to be certified for Zone 4 earthquake resistance, telecommunications equipment is required to undergo a vibration test which involves vibrational accelerations of up to 5 g. The equipment, which could, in use, be carrying emergency traffic, such as 911 calls, must be operational after the test is conducted without manual resetting or adjustment (so that in an earthquake scenario it would not require an operator to enter a potentially dangerous building to reset or repair the equipment.

It is therefore an object of the present invention to provide an improved method of mounting telecommunications equipment, and in particular to provide a rack and a shelf providing greater earthquake resistance to telecommunications equipment stored therein.

Due to the large amount of telecommunications equipment already deployed in rack structures, it is a further object of the invention to provide improved earthquake resistance, and preferably Zone 4 compliance, to existing racks and shelves which can be easily retrofitted in current installations with minimal modification of the shelves. Because existing shelves have been certified for structural strength and EM shielding, any significant modifications to shelf structure will require the modified design to be reassessed.

SUMMARY OF THE INVENTION

The invention provides a mounting bracket for mounting an equipment housing to a rack. The mounting bracket has a bracket body for rigid attachment to the housing, a fastener for rigid attachment to the rack, and a damping member coupling the fastener and the bracket body.

The damping member isolates the housing and bracket body from the rack and fastener, so that vibrations carried by the housing can only be transmitted to the housing via the damping member.

The conventional way of increasing earthquake resistance for telecommunications racks is to overengineer the rack structure itself and thereby prevent damage to the rack and preventing the equipment from e.g. breaking loose. The present invention takes a different approach by recognising that not all vibrations can be eliminated from the rack, even when the resonant frequency of the rack is increased it thus provides a bracket which isolates the loaded rack into a number of distinct sub-systems, each mechanically connected only via damping members.

The damping member is preferably an elastomeric material such as a silicone. Particularly preferred is very high density silicone, having a modulus of 10–15 daN/cm$^2$.

In the preferred embodiment, the bracket body is in the form of a plate which engages with a side panel of the housing, extending from the front to the rear. A flange which is perpendicular to the plate and depends from the front edge carries the damping member.

Such a bracket is particularly suited for fitting to equipment housing to be carried in ETSI-compliant racks, where the mounting is at the front.

In preferred embodiments a rear mounting is located adjacent the rear edge of the plate. This rear mounting also has a fastener for rigid attachment to the rack, and a rear damping member coupling the rear fastener to the bracket body.

It has been found that conventional ETSI or front-mounted shelves can be damaged by the fact that whereas the support is at the two front side edges, the centre of gravity is towards the centre of the shelf. By providing a further mounting at the rear of each side, the housing is dramatically stabilised during earthquake tests.

In one embodiment to be described below, the rear damping member takes the form of a solid cylinder of elastomeric material, and the bracket body and the fastener are coupled to the opposite faces of the cylinder.

This cylinder is preferably carried with its axis running vertically to absorb vertical vibrations, since the damping member between the front flange and the rack mounting rail will absorb horizontal vibrations.

In another embodiment the rear damping member and the front damping member each take the form of a an annular cylinder, i.e. a substantially cylindrical body of elastomeric material having an axial bore. The fastener, which may be e.g. a bolt, is carried in the bore and the bracket body is mounted on the external surface of the cylinder.

In a particularly preferred embodiment, the fastener is a shoulder bolt having a head, a threaded section, and a shank defining a shoulder between the head and the threaded section, for engagement with a threaded hole in a surface of the rack. The bolt passes through the centre of the bore, and when the bolt is tightened so that the shoulder meets the surface of the rack, the annular cylinder is compressed between the head of the bolt and the rack surface.

Since the damping characteristics of the damping member are determined by its composition, shape, size, and applied forces, this shoulder bolt allows a very precise and repeatable application of a compressive force resulting in a predictable damping vs. frequency response.

The bracket may be anchored to the housing by a hook provided on the bracket body which engages a lip on the housing.

Preferably the bracket body takes the form of a pair of separable body members, each having one of the hooks for engagement with a respective lip on the housing, so that the hooks may be brought into anchoring engagement with the lips by connecting the body members together.

This embodiment is particularly valuable for retrofitting to existing shelves. The bracket can be hooked into place on existing protrusions on the shelf, and the two halves fastened together to secure the bracket. Further securing may then be effected using existing bolt holes, riveting point, etc. to which the conventional mounting bracket was attached. In this way, the bracket of the current invention is more securely fastened than that which it replaces, but there is no necessity to e.g. drill new holes which will change the structural or electromagnetic characteristics of the housing.

A subsidiary bracket may be connected to the bracket of the invention, for mounting an associated equipment housing (e.g. a fan housing) to the rack, so that under vibrational stress the equipment housing and the associated equipment housing move as a single unit. Of course the fan housing or other associated equipment housing may be mounted by means of a bracket according to the invention, and the subsidiary bracket may itself be a bracket according to the invention connected to a main bracket.

The damping member preferably has a vibrational absorption profile which absorbs energies at frequencies of less than about 20 Hz. The natural frequency of the damping member itself, in its uncompressed state is preferably from about 20 Hz to about 60 Hz, more preferably from about 30 Hz to about 40 Hz. When in its compressed state in use, the natural frequency of the damping member is preferably from about 35 Hz to about 45 Hz, most preferably about 40 Hz.

In another aspect the invention provides an equipment housing in the form of a box-like structure having an open front, with a mounting bracket as described above rigidly connected to each side wall of the box.

In another aspect there is provided a rack for mounting equipment housings, the rack having a base, a pair of elongate parallel side members projecting upwards from the base and coupled at their top ends by a top member. Each of the side members has a pair of spaced apart parallel rails extending substantially along the length of the side members, each of the rails having a series of mounting points (such as threaded holes) distributed along its length, whereby each side member may accommodate front and rear sets of fasteners for equipment mounting brackets.

Preferably, where the rack holds equipment housings mounted by a bracket of the present invention, the damping members having a vibrational absorption profile with a maximum response at a frequency approximately equal to a resonant frequency of the rack.

In a further aspect of the invention there is provided a mounting bracket for mounting an equipment housing to a rack, the mounting bracket having a bracket body for rigid attachment to the housing, and a fastener for rigid attachment to the rack, the bracket body having a pair of separable body members, each having a hook for engagement with a respective lip on an equipment housing, such that the hooks may be brought into anchoring engagement with the lips by connecting the body members together.

The invention also provides a method of mounting such a bracket to an equipment housing, the method involving the steps of engaging each of the hooks with a respective lip, and connecting the body members to one another when the hooks are engaged to anchor the bracket to the housing.

The invention further provides a method of mounting an equipment housing to a rack by means of a pair of brackets on opposite sides of the housing, each bracket having a front and a rear fastener, the method involving the steps of placing the housing into the rack between a pair of rack side members such that the front fasteners are in registering alignment with a respective mounting point on a front rack rail of each side member and the rear fasteners are in registering alignment with a respective mounting point on a rear rack rail of each side member, and fastening the fasteners to the mounting points.

BRIEF DESCRIPTION OF DRAWINGS

The invention will now be illustrated by the following descriptions of embodiments thereof given by way of example only with reference to the accompanying drawings, in which.

DETAILED DESCRIPTION OF PREFERRED EMBODIMENTS

Figure 1:
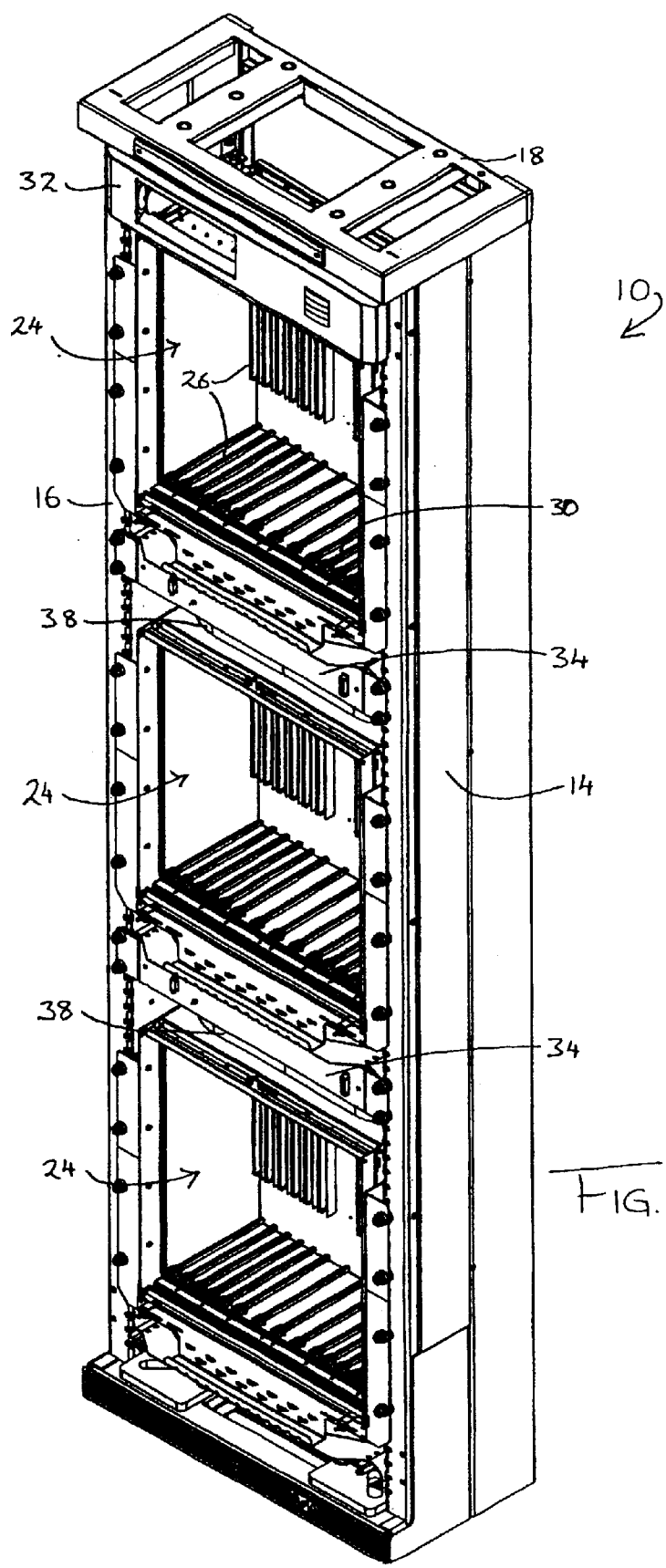
FIG. 1 is a perspective view of a rack system according to the present invention.

FIG. 1 shows a rack 10 according to the invention. The external appearance of the rack is essentially conventional as it conforms to the ETSI standard. The rack 10 comprises a base section 12, a right-hand side member 14 and left-hand side member. A top member 18 couples the free upper ends of the side members.

Base member 12 has a plurality of bolt-receiving slots 20,22 and is designed to be pre-stressed by overtightening bolts received in these slots to raise the vibrational response of the rack in the manner described in U.S. Pat. No. 5,975,315, the contents of which are incorporated herein by reference.

In the rack 10 of FIG. 1, three shelves or sub-racks 24 are mounted in the manner to be described below. Each shelf has a number of slots defined by runners 26 on the rear internal face 28 and base internal face 30 in known manner. These runners receive the telecommunications equipment which may be e.g. optical or electronic switching circuitry embodied on cards held in the slots. The shelves are provided with terminal connections, power supplies, etc., to enable the cards to communicate with a telecommunications network, again in known manner.

A rack alarm unit 32 is provided above the uppermost of the shelves 24. A pair of cooling fan units 34 are provided below the uppermost and middle shelves, respectively, and a filter unit 36 is provided below the lower shelf. The rack alarm unit 32 monitors environmental conditions, power supplies, etc., and provides alarms in the event that parameters are breached, and the filter and fan units operate to draw a flow of cooling filtered air upwards through the shelves via a pair of ducts 38 provided above and below the middle shelf.

Figure 2:
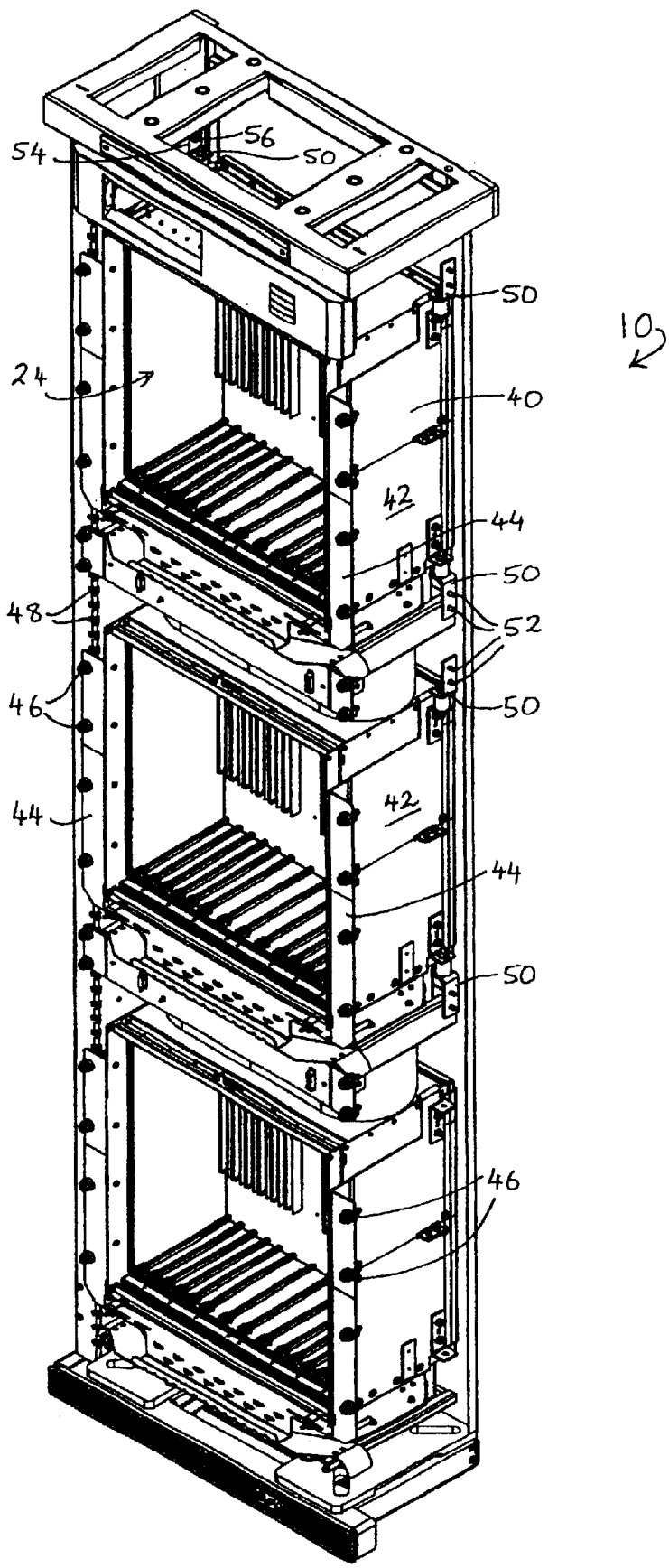
FIG. 2 is a perspective view of the rack system of FIG. 1 with a side panel removed for illustrative purposes.

Referring additionally to FIG. 2, the same rack 10 can be seen with the right-hand side member (14 in FIG. 1) removed. Mounted to the right-hand side of each of the shelves 24 is a bracket 40 having a relatively large shelf-engaging surface 42 and a perpendicular lip 44 extending away from the shelf at the front surface thereof. Lip 44 has a number of bolts 46 for connecting the bracket 40, and thus the shelf to which the bracket is attached, to the side member 14 (not shown in FIG. 2). A mirror image of bracket 40 is connected to the left-hand side of the shelf, though only the perpendicular lip 44 can be seen. On the left hand side member 16, there are provided a series of threaded holes 48 (which are also on the right-hand side member 14) which receive the bolts 46 and thereby allow the mounting of the brackets 40 to the side members 14,16.

A pair of rear mountings 50 are connected to the upper and lower portions respectively of the rear edge of the mounting brackets 40. Each rear mounting has a pair of threaded bolts 52 extending outwardly for connection to a vertical rail mounted internally on each side member. The mountings on the lowest of the shelves is omitted from the drawing, but is normally present. The left-hand vertical rail 54 is largely hidden in FIG. 2 but can be seen in the firmest corner above the uppermost shelf. A series of threaded holes 56 is provided along the length of this rail, for engagement with the outwardly extending bolts on the rear support brackets at the left-hand side of the shelves. An identical rail is not shown in FIG. 2 due to the removal of the right-hand vertical side member, but is normally present and extends throughout the height of the rack in the interior of the rear right-hand corner.

Figure 3:
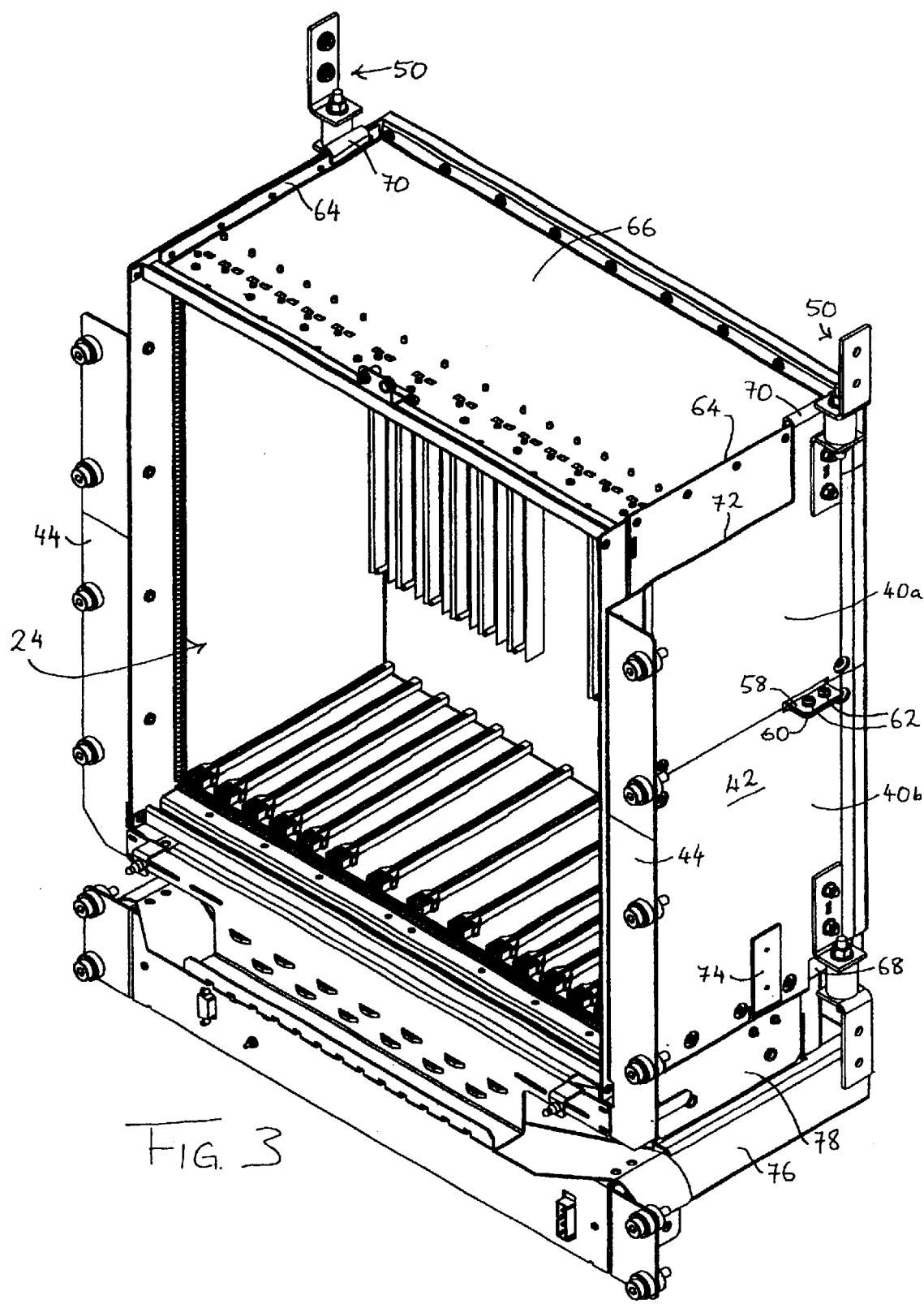
FIG. 3 is a perspective view of a shelf for mounting in the rack of FIG. 1 with a mounting bracket according to the invention in place.
Figure 4:
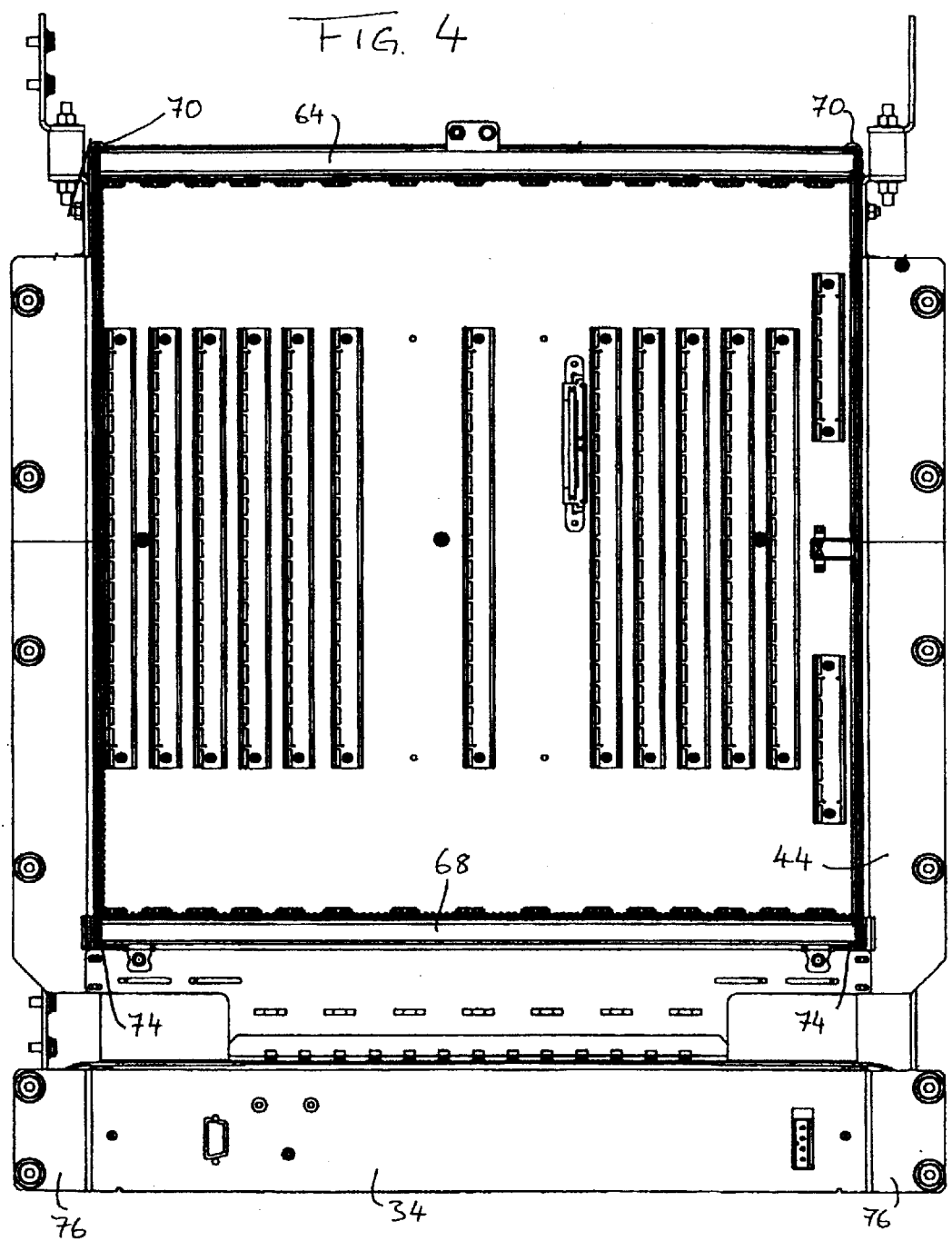
FIG. 4 is a front elevation of the shelf and mounting bracket of FIG. 3.
Figure 5:
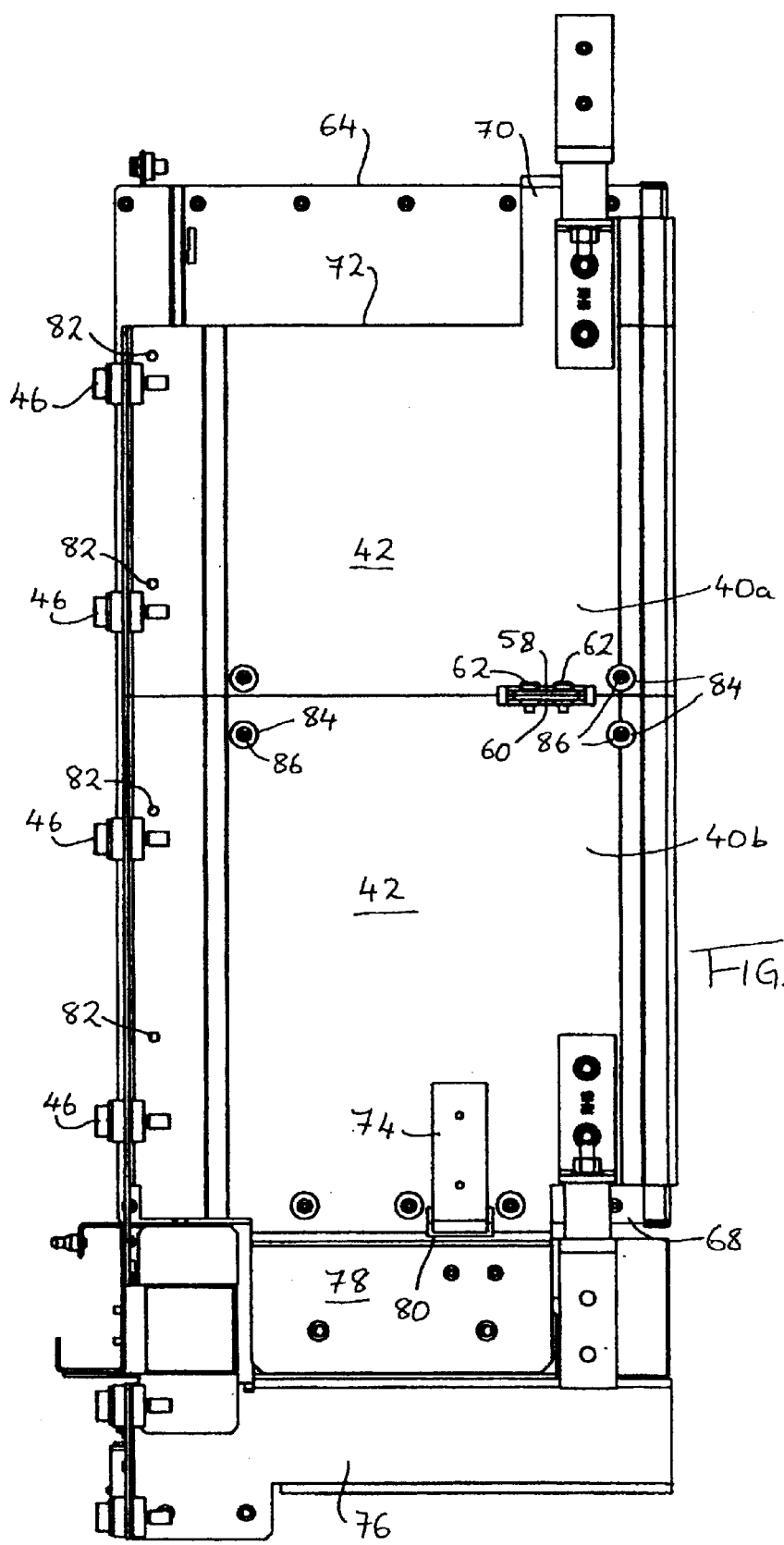
FIG. 5 is a side elevation of the shelf and mounting bracket of FIG. 3, taken from the right-hand side.

FIGS. 3 and 4 show a perspective view of shelf 24 with mounting bracket 40 attached. The shelf is a TN4XE (Optera Metro 4100/4200) shelf available from Nortel Networks of standard proportions for fitting into an ETSI rack. A fan unit 34 is mounted below the shelf. FIGS. 4 and 5 show the shelf in front elevation and side elevation, respectively.

Referring to FIG. 3, the bracket is formed in two halves, i.e. an upper half 40a and a lower half 40b. Thus, the shelf engaging surface and the perpendicular lip 44 each have upper and lower halves. The two halves are formed by stamping and forming sheet metal to provide the shelf engaging surface and the perpendicular lip 44. A pair of connection flanges 58,60 project from the lower edge of the upper half 40a and the upper edge of the lower half 40b, respectively such that when these connection flanges are in overlapping engagement the upper and lower halves of the perpendicular lip 44 are aligned. Connection is made by a pair of nut-and-bolt fastenings 62.

It can be seen that the shelf 24 has a raised lip 64 projecting from the periphery of the top surface 66. A similar lip 68 projects from the underside (not visible) of the shelf 24. An upper J-shaped hook 70 extends from the top 72 of the bracket and a lower J-shaped hook 74 is provided towards the bottom of the bracket.

Upper hook 70 is integral with the upper half of the shelf-engaging surface 42, whereas lower hook 74 is welded to the lower half of shelf-engaging surface 42. This is because bracket 40 is mounted to a fan support bracket 76 by means of an extension plate 78 which is also integral with the shelf engaging surface 42. Because extension plate 78 extend below the lower lip 68 (with which lower hook 74 must engage), it is more cost-effective to form the lower half of the bracket 40*b* and the extension plate 78 from a single piece of sheet metal and to add lower J-shaped hook 74 by welding.

The upper and lower hooks 70,74 clamp the bracket 40 to upper and lower lips 64,68 (see also FIGS. 4 and 5). In order for the bracket to be easily retrofitted, the connection flanges 58,60 are fastened together after the hooks 70,74 are fitted over the lips 64,68. It can be seen from FIG. 5 that the lower hook 74 extends through the plane of the shelf-engaging surface 42 through an aperture 80. When the two halves have been secured together in place on the shelf, the bracket is further secured by means of four fasteners 82 known as PEMs (trade mark), which are self-clinching nuts available from Pennsylvania Engineering and Manufacturing Corp., Danboro, Pa. These fasteners provide permanent load-bearing threads in metal sheets too thin to be tapped. Alternative fastenings, such as nut-and bolt-fasteners could of course be used.

FIG. 5 also shows a number of clearance holes 84 which are provided for access to rivets 86 in the shelf.

Figure 6:
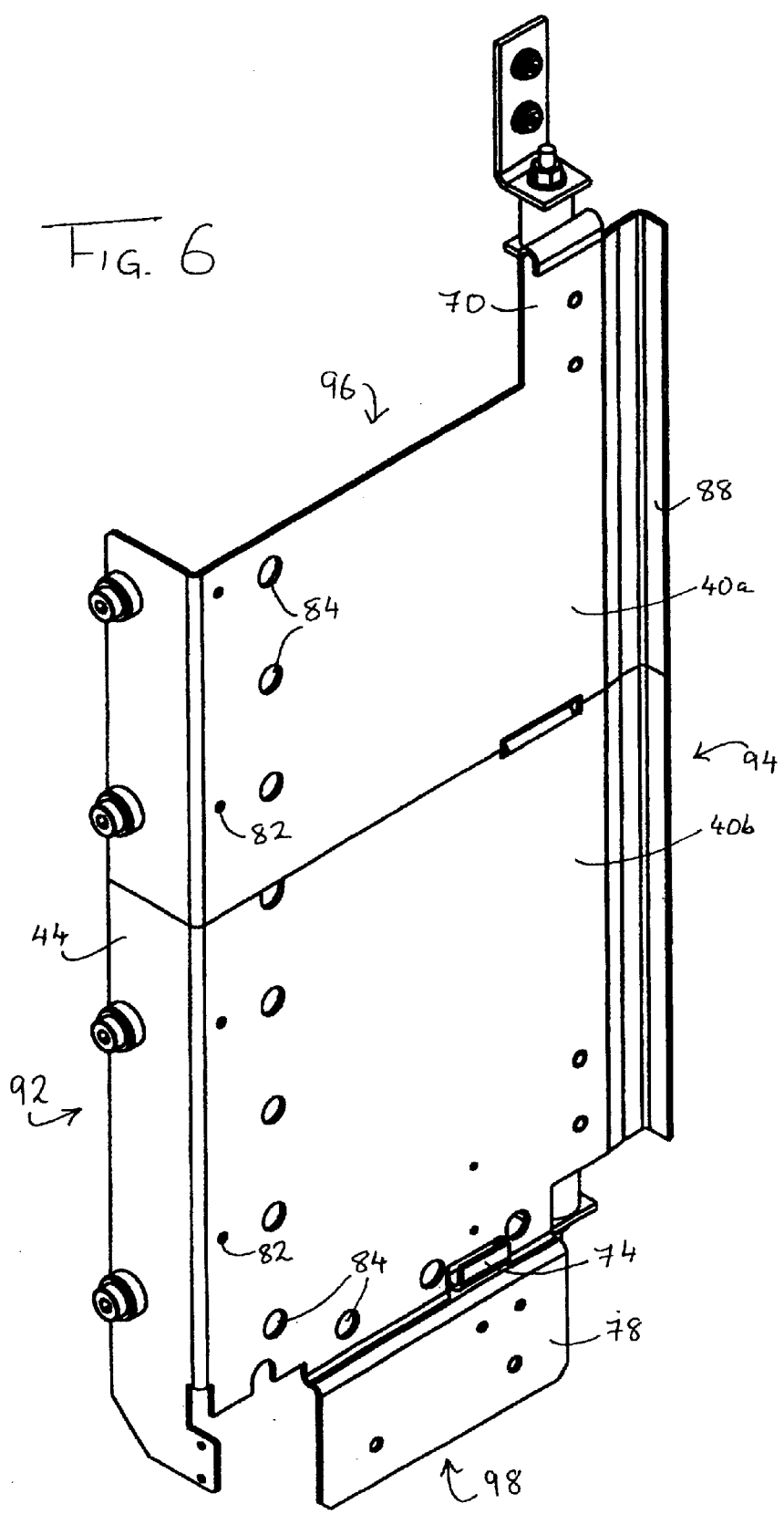
FIG. 6 is a perspective view of the left-hand side mounting bracket when removed from the shelf of FIG. 3.
Figure 7:
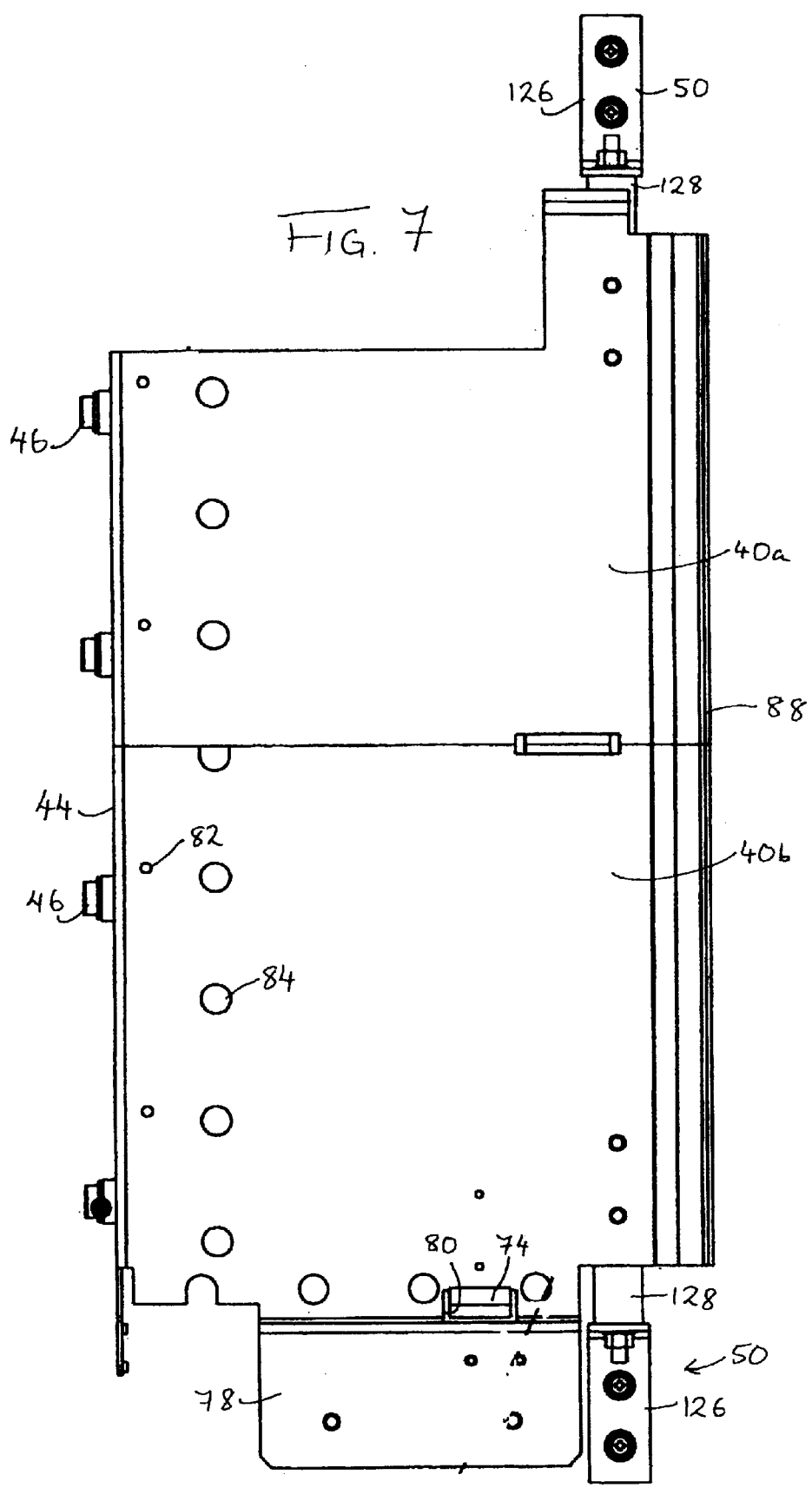
FIG. 7 is a side elevation of the inner surface of the mounting bracket of FIG. 6.
Figure 8:
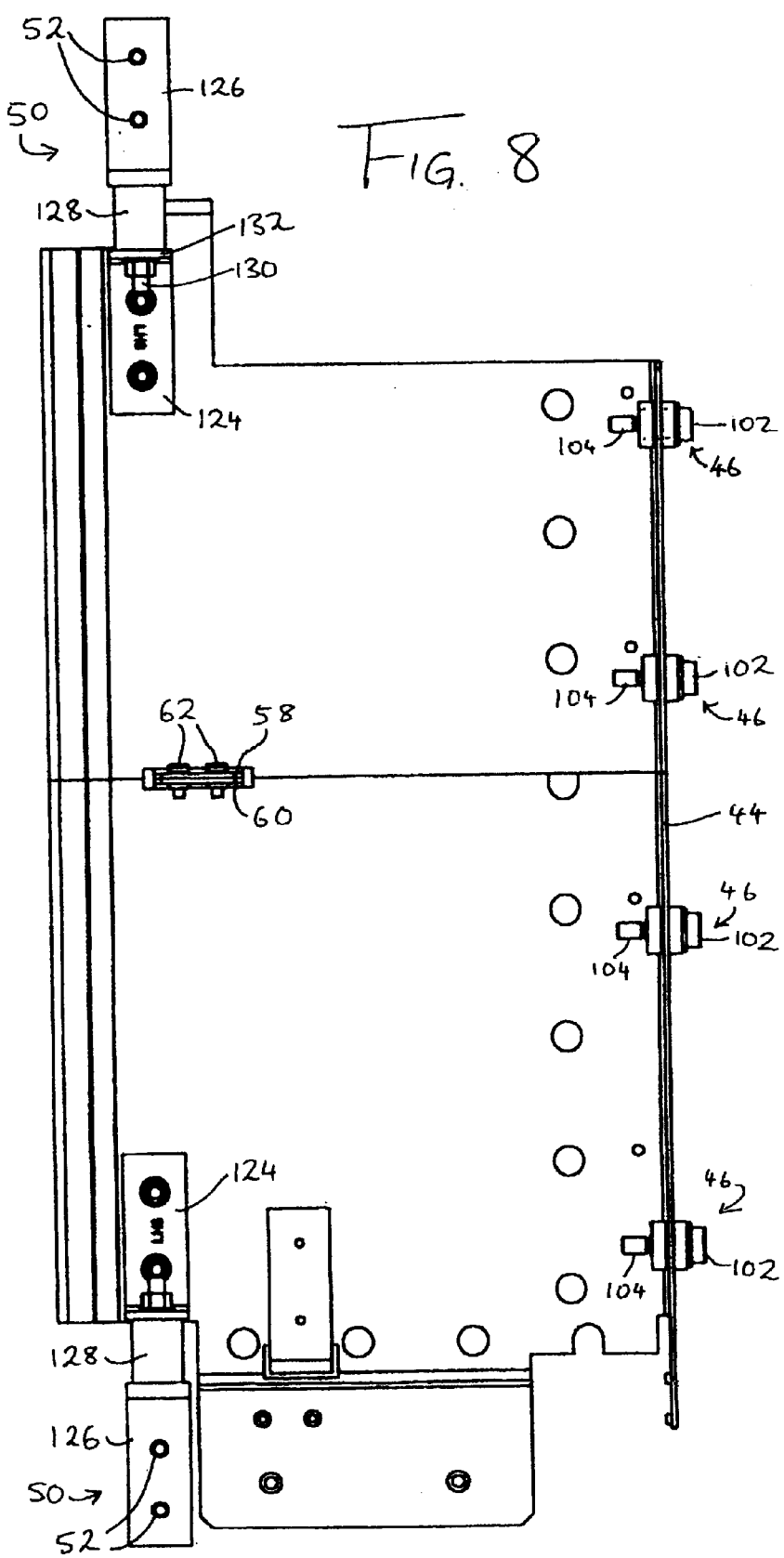
FIG. 8 is a side elevation of the outer surface of the mounting bracket of FIG. 6.
Figure 9:
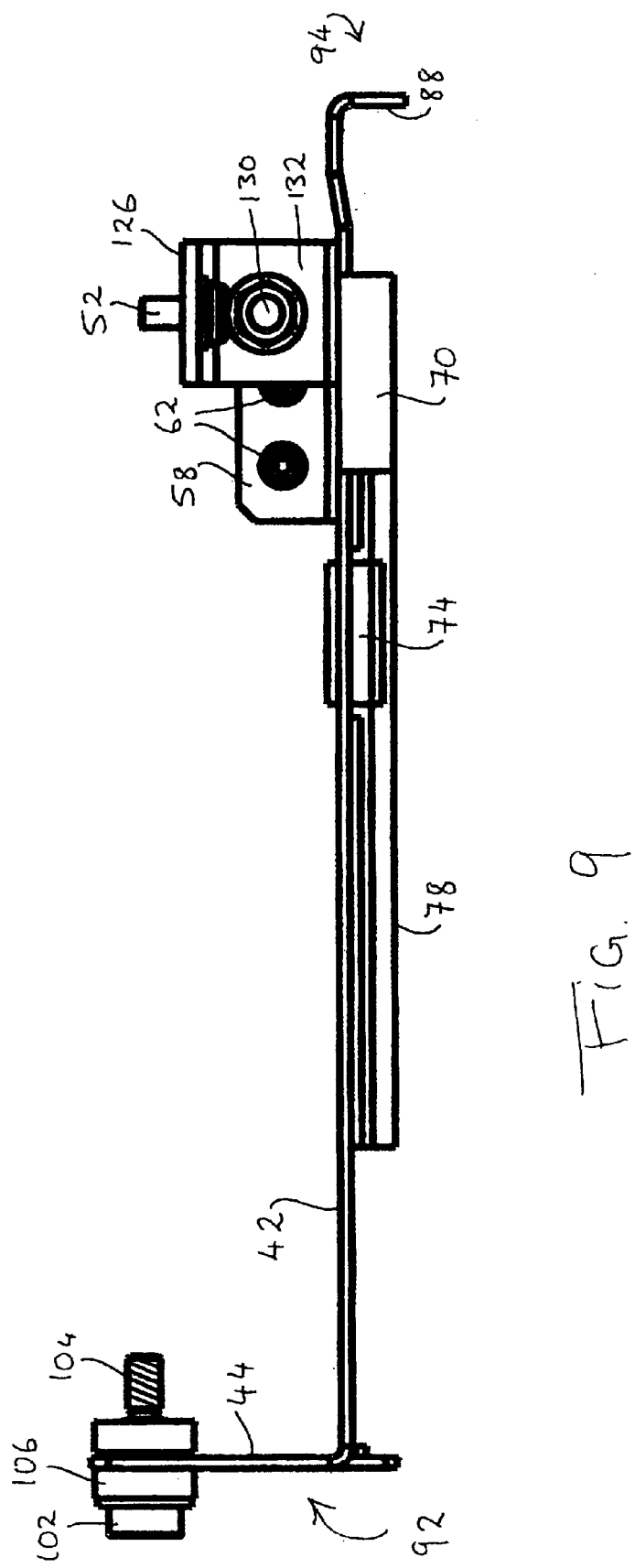
FIG. 9 is a plan view from above of the mounting bracket of FIG. 6.

FIG. 6 shows in perspective the left-hand bracket which is almost a mirror image of that shown in FIG. 5 (apart from the rivet clearance holes 84 which are differently positioned to allow access to the rivets located on the left-hand side of the shelf). Therefore the same reference numerals will continue to be used. The bracket 40 is shown unattached to the shelf. FIG. 7 shows the inner surface (closest to the exterior of the shelf in use) of the left-hand bracket, and FIG. 8 the outer surface. FIG. 9 is a plan view from above.

In FIGS. 6–9, the generally L-shaped nature of the bracket is visible, with the shelf-engaging surface 42 at right angles to the perpendicular lip 44. A positioning lip 88 is provided at the opposite (rear) edge to engage the rear of the shelf when the two halves are being connected together. This helps in aligning the holes of the bracket with the receiving self clinching nut inserts of the shelf.

For ease of reference, the bracket of FIG. 6 is shown with arrows designating the front 92, rear 94, top 96 and bottom 98 of the bracket, in the sense that the terms are used herein (with the frontal direction being the direction to the open front of the rack, when the shelf is mounted using this bracket.

As indicated above, the front surface of the side member 16 of the rack (FIG. 1) has a series of threaded holes each designed to receive a shoulder bolt 46. The bracket 40 has four such shoulder bolts 46 each having a head 102 projecting to the front and a threaded section 104 projecting rearwardly from the mounting lip 42 (see FIG. 8). Each bolt 46 is snugly accommodated within a damping member 106 which is itself accommodated in a hole in the mounting lip.

Figure 11:
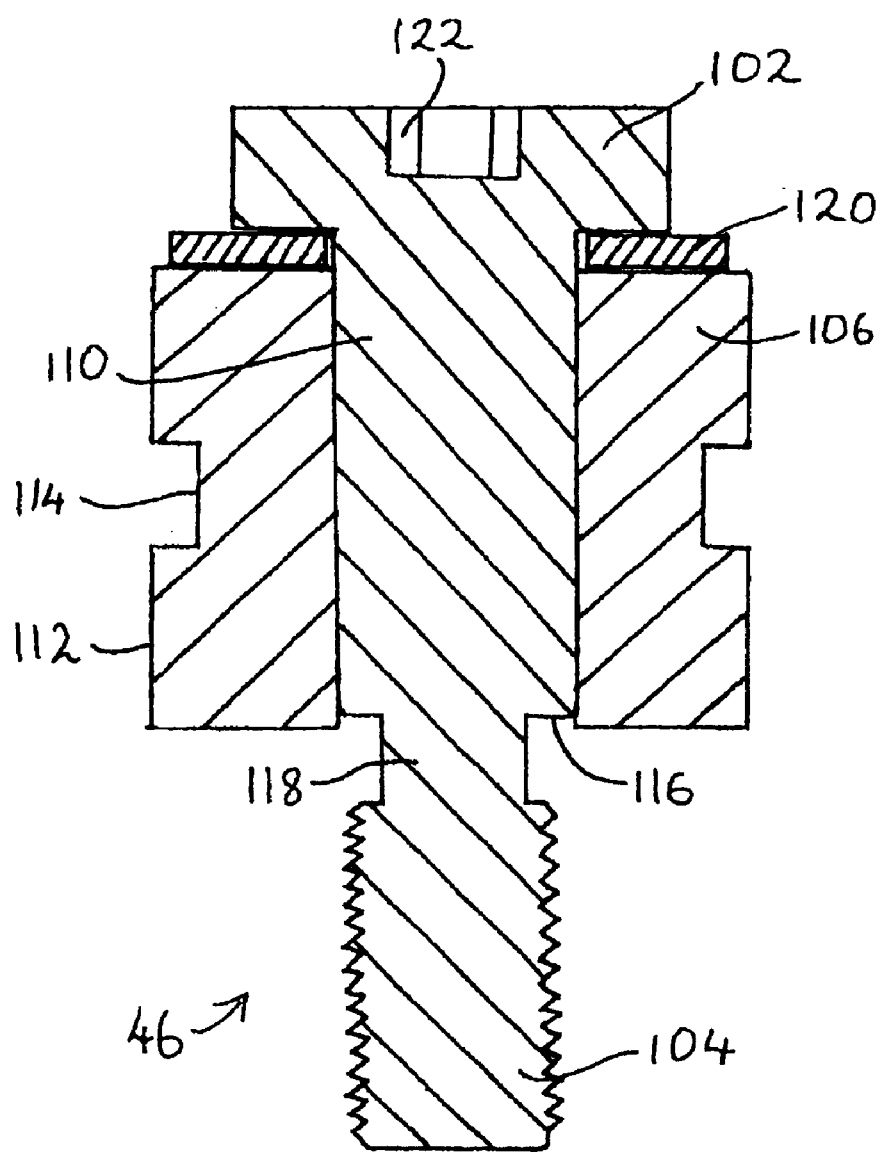
FIG. 11 is a cross section of a damping member of FIG. 6 with a bolt in place.
Figure 12:
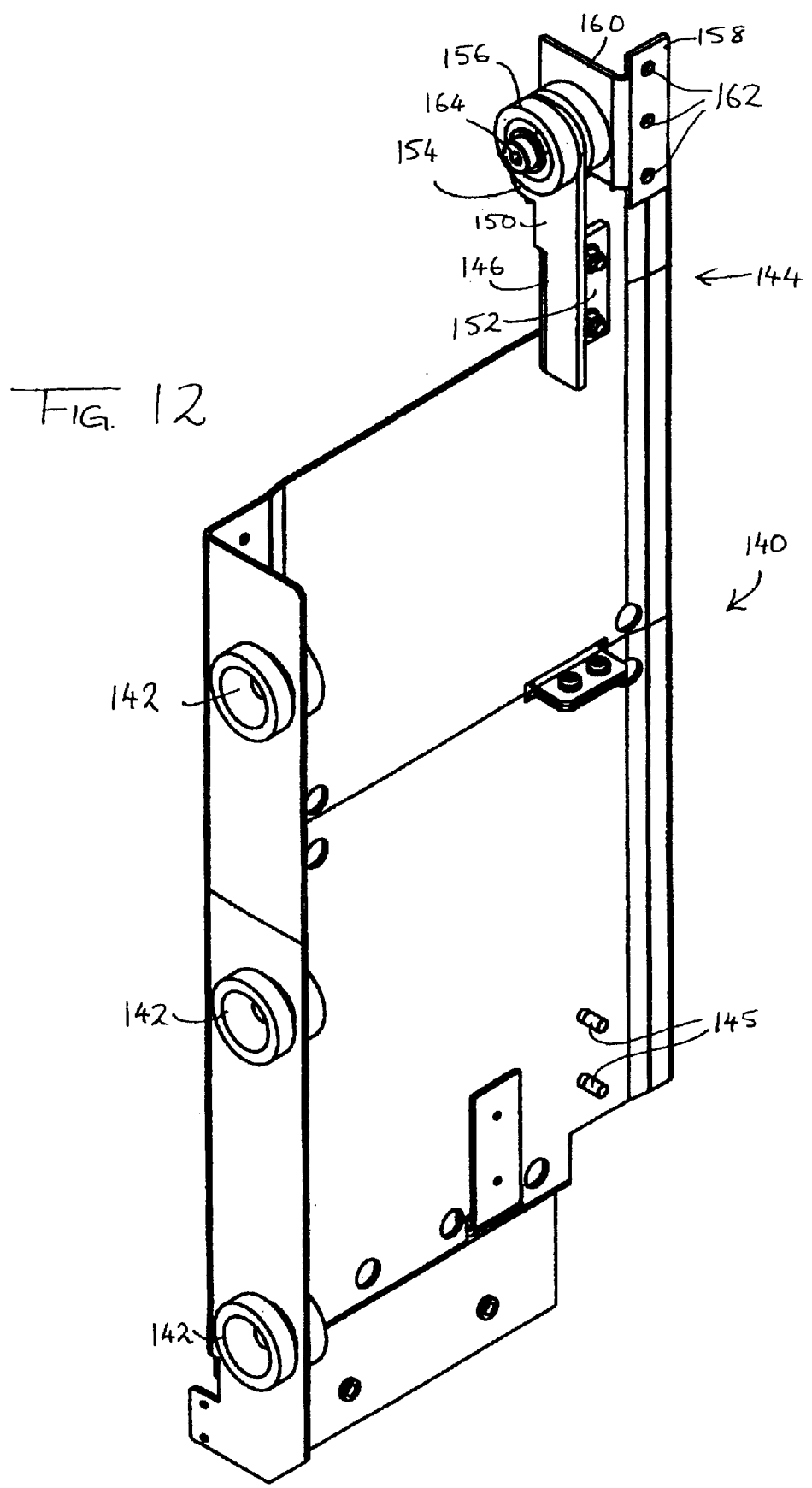
FIG. 12 is a perspective view of an alternative embodiment of a right-hand side mounting bracket according to the invention.
Figure 13:
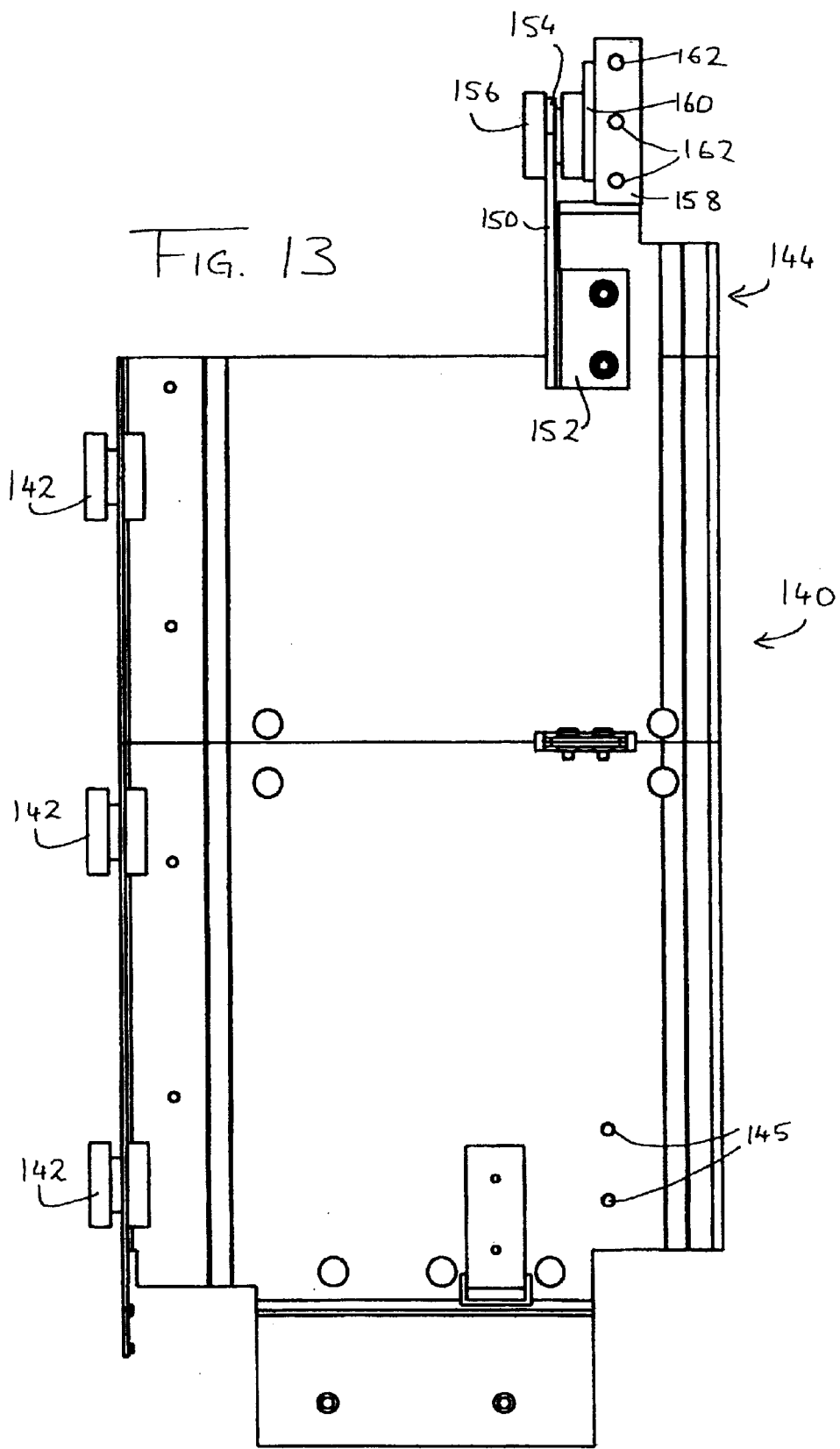
FIG. 13 is a side elevation of the inner surface of the mounting bracket of FIG. 12.
Figure 14:
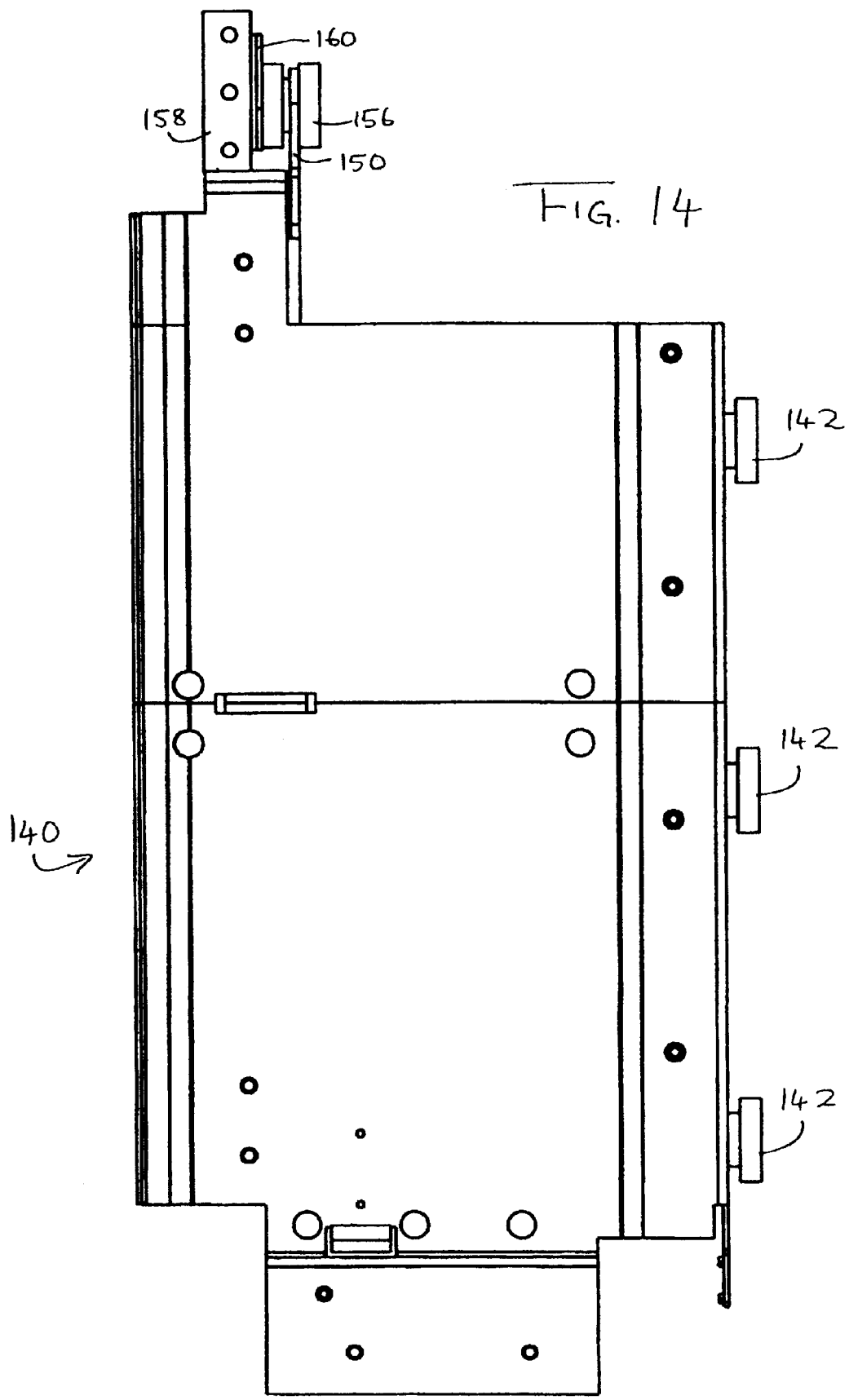
FIG. 14 is a side elevation of the outer surface of the mounting bracket of FIG. 12.
Figure 15:
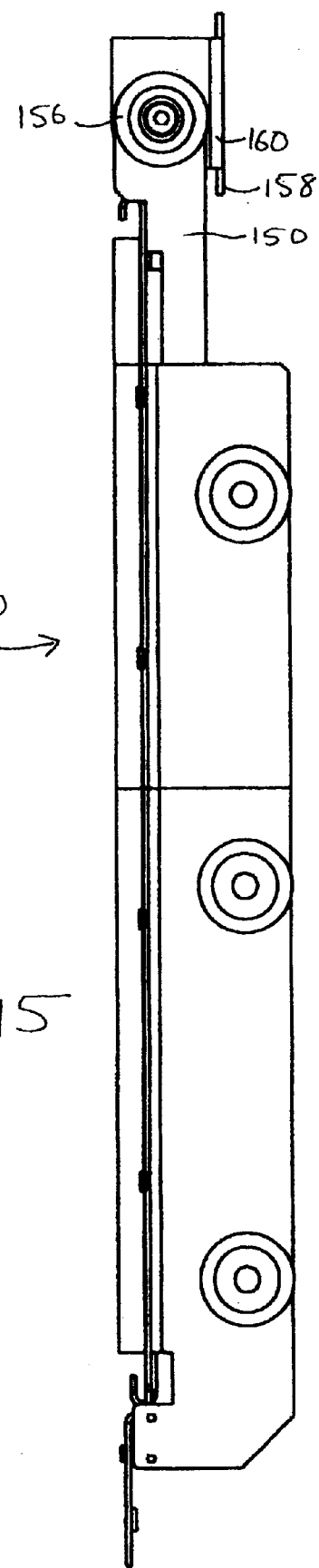
FIG. 15 is a plan view from above of the mounting bracket of FIG. 12.
Figure 16:
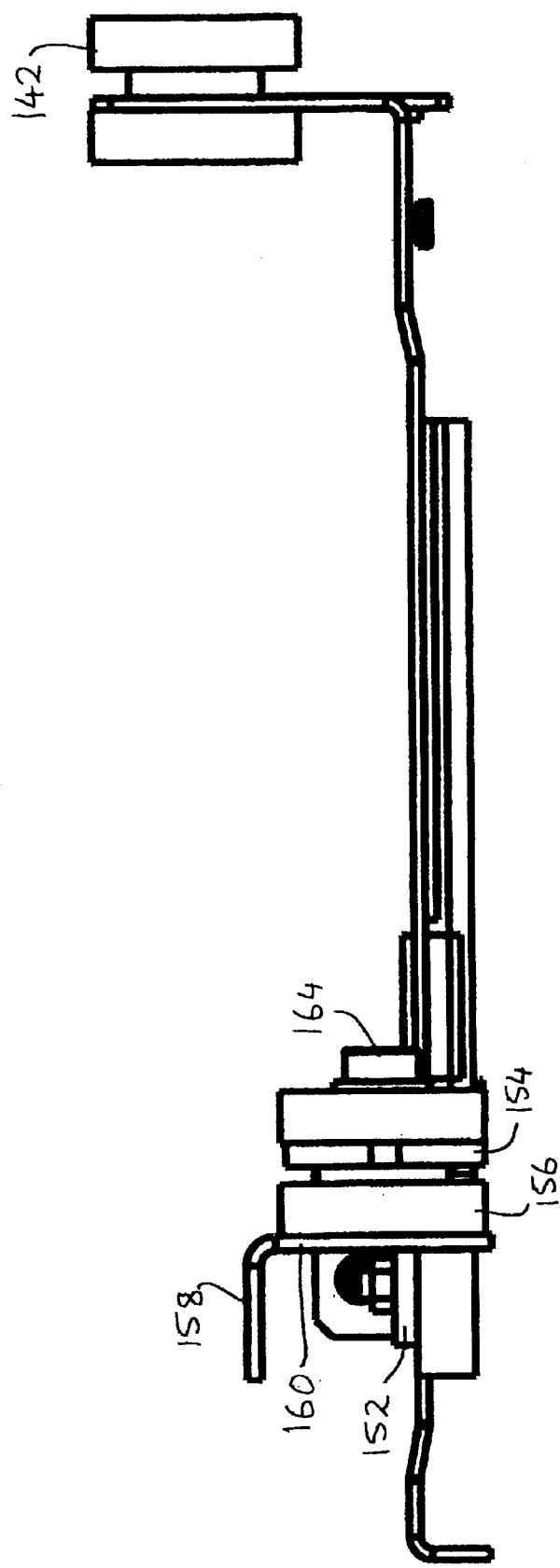
FIG. 16 is a front elevation of the mounting bracket of FIG. 12.

FIG. 11 shows in cross section a damping member 106 with a bolt 46 in place. The damping member 106 is generally cylindrical having a constant bore 108 along its central axis to receive the shank 10 of the bolt (the section between the head 102 and threaded section 104). The external surface 112 of the damping cylinder has a waist 14 which retains the damping member in place when fitted into an aperture in a mounting lip (not shown in FIG. 11.

The shank 10 of the bolt is of a diameter intermediate between that of the head 102 and that of the threaded section 104. Just before the shank emerges from the damping cylinder 106 it steps down in diameter at a shoulder 16 to a short section 18 having a diameter less than that of the threaded section.

A steel washer 120 sits between the head 102 and damping member 106 to distribute the pressure applied by the bolt head more evenly to the damping member.

In assembling the bracket 40, the damping cylinder, which is formed of a flexible elastomer (very high density silicone, 10–15 daN/cm$^2$ modulus) is squeezed into the hole in the mounting lip. This hole has a diameter approximately equal to that of the waist 114, so that the damping cylinder, once compressed into the hole, sits tightly in place.

When the bracket 40 is attached to the shelf 24 (FIG. 3), the shelf is mounted on the rack by inserting the threaded sections 104 of the respective shoulder bolts 46 into the mounting holes 48 (FIG. 2) and tightening the bolts using a hexagonal key (Allen key) in a hexagonal recess 122 in the bolt head. The bolt is tightened until the shoulder 116 meets the front surface of the rack in which the mounting holes 48 are provided (in other words, the short section 108 of the bolt will be entirely within the threaded mounting hole). This has the effect of slightly compressing the damping cylinder by a predetermined degree between the washer 120 and the rack front surface. As the cylinder compresses axially, it will tend to expand radially, ensuring an even snugger fit between the hole in the mounting lip 44, the cylinder 106 and the bolt 100.

According to the vibrational characteristics of the material chosen for the damping member, earthquake-induced (or similar) vibrations applied to the rack will tend to be damped by the situation of the damping member between the mounting means and the bracket, so that the vibrations are absorbed before they reach the equipment in the shelf. Even if the rack itself is lightly damaged by an earthquake, the provision of a damping member in this way will assist in ensuring that the telecommunications equipment functions correctly after the earthquake without manual rebooting or repair.

Figure 10:
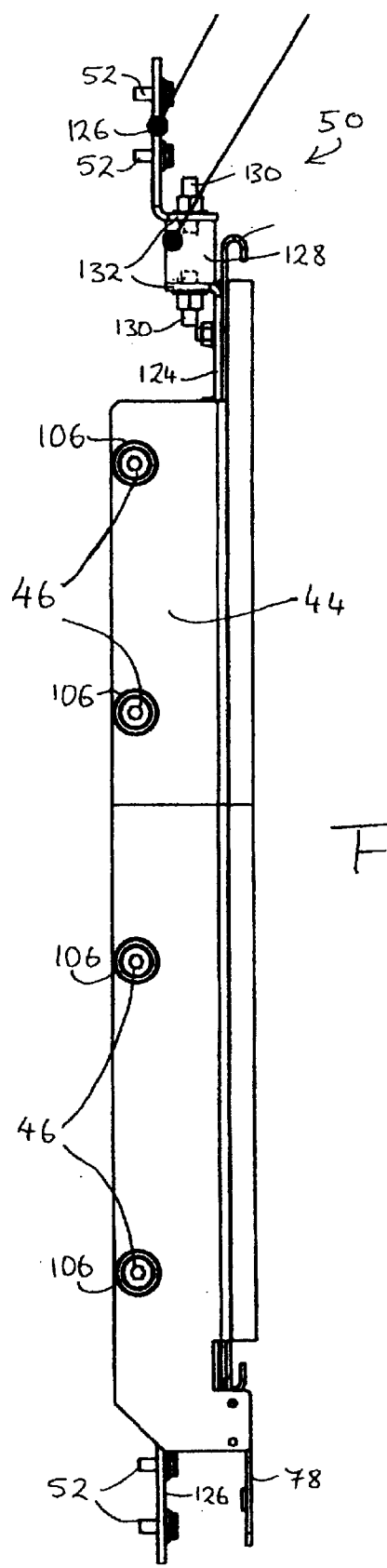
FIG. 10 is a front elevation of the mounting bracket of FIG. 6.

As indicated previously, rear mountings 50 are additionally provided on the bracket. Referring back to FIG. 8, these mountings are visible at the rear 94 of the bracket, i.e. a top rear mounting 50*a* and a bottom rear mounting 50*b*. Each comprises a pair of L-shaped brackets 124, 126 which are inverted with respect to one another (see also FIG. 10, in which the upper pair of brackets can be seen from the side. Of each pair of brackets, one (124) is bolted to the mounting bracket 40, and the other (126) is provided with a pair of bolts 52 for mounting to the threaded holes in the rear internal vertical rail 54 (FIG. 2).

Between the two L-shaped brackets, a damping member 128 is provided.

Damping member 128 is in the form of a solid elastomeric cylinder into which are moulded a pair of threaded steel sections 130 one of the threaded sections 130 projects from either face of the damping member to enable the shorter arm 132 of the respective L-shaped brackets to be mounted to the faces of the damping member.

ETSI racks are not normally provided with rear mountings for the shelves they contain, and the provision of rear mountings for the shelves has the effect of stabilising the mass of the shelf (which might typically have a centre of gravity in the centre of the shelf cavity, when loaded with equipment. By supporting the shelf at the front edges and also at the rear corners, movement due to vibration is greatly reduced.

The vibration itself is further damped by the damping members 128 in the rear mountings, and as the axis of this cylinder is vertical it tends to absorb more of the vertical vibrations (the horizontal cylinders 46 at the front of the bracket tend to absorb back-and-forth horizontal vibrations).

In effect, the assembled shelves and the rack can be seen during an earthquake to comprises a number of distinct systems. On the one hand there is the rack structure per se in combination with the shoulder bolts 46, rear mounting bolts 52 and the attached L-shaped brackets 126. On the other hand there is a distinct system formed by each shelf 24, mounting bracket 40, and attached L-shaped plate 124. Between each of the latter systems and the rack system, there is elastomeric damping.

Typically, the size and shape of the damping members and the material from which they are made will be open to variation. However, it is preferable that the damping member is adapted to strongly absorb vibrations at frequencies of less than 20 Hz where the energy of an earthquake is concentrated, most particularly at frequencies of below 15 Hz. The resonant frequency of the damping member should be outside this range and above the resonant frequency of the loaded rack (typically about 8–15 Hz), so that any resonance generated by the rack is absorbed from transmission to the shelf. Thus, while the rack is designed to have a resonant frequency of more than 5 or 6 Hz, it is likely that some higher frequency vibrations from the earthquake will be transmitted and amplified through the rack at frequencies of e.g. 10 Hz. The damping members absorb this and thereby prevent resonance within the rack structure from being transmitted to the telecommunications equipment, thereby increasing the chances of the equipment functioning without manual intervention after a severe earthquake.

While there is a desire to increase the resonant frequency of the damping member above the range of frequencies generated by earthquakes (and used in earthquake compliance testing), there is a limit as to how high this frequency should be. If the resonant frequency of the damping member is too high, this will generally equate to a very stiff damping member, which will not adequately absorb low frequency vibrations. For this reason, the resonant frequency of the damping member should not be above 40 Hz. When the damping member is in use (compressed with a higher than normal resonant frequency), a resonant frequency of about 35–45 Hz has been found to be desirable. For the damping members used in the present embodiment, this equates to a resonant frequency when relaxed of about 30–40 Hz.

Referring back to FIG. 3, as a further protection against vibration induced damage, the shelf carries the fan unit 34 by means of the attachment between the extension plate 78 and the fan bracket 76. Fan bracket 76 is damped identically to mounting bracket 40 at the front by means of damping members 46. In order to prevent the fan unit from colliding with the shelf, however, the respective brackets 40,76 tie the shelf 24 and fan unit 34 together as a single unit.

An important point to note about the embodiment of the invention described above is that not only are the components divided between vibrationally independent systems which are separated by damping members; they are also electrically isolated from one another by the polymeric dampers, eliminating the normal earthing of the shelf via the rack. While this might be seen as disadvantageous, it is in fact easily overcome by a dedicated flexible earth connection between the rack and the shelf housing, and is more than compensated for by the vastly improved vibrational damping.

FIGS. 12–16 show an alternative embodiment of mounting bracket according to the invention. This mounting bracket, indicated generally at 140 is of very similar overall design to mounting bracket 40, and thus only the differences will be described.

The mounting bracket 140 has three front damping members 142 which are larger than the damping members of the earlier embodiment, but are similarly formed of an elastomeric material and are compressed between the bracket and a set of shoulder bolts.

A rear mounting is shown at the upper rear corner 144. A similar mounting (not shown) is provided at the bottom of the bracket, where it locates on the two self-clinching inserts 145 directly below the upper bracket 144. This mounting comprises a lower bracket 146 and an upper bracket 148. The lower bracket 146 is formed from a planar generally L-shaped piece of metal which is bent through 90 degrees along the line defined by one edge of the longer leg 150. The shorter leg 152 is bolted to the main body of the mounting bracket 140. The longer leg 150 has an enlarged free end 154 with an aperture of identical dimensions to the apertures in which the front damping members 142 are located. An identical damping member 156 is situated snugly in this aperture in the manner previously described.

The upper bracket 148 is formed from a generally T-shaped piece of metal having a leg and a head, bent through 90 degrees along the line connecting the head 158 and the leg 160. A series of holes 162 in the head section is provided to enable bolting of the upper bracket 148 (and thus the mounting bracket 140 and shelf on which it is mounted) to a rear internal vertical rail having a series of threaded holes.

The lower and upper brackets 146,148 are connected by a shoulder bolt 164 which is received in a threaded hole (not visible) in the leg 160 of the upper bracket. Thus in similar fashion to the earlier embodiment, the mounting bracket 140 and lower bracket 146 form a separate vibrational system from the shoulder bolt 164, upper bracket 148, rack structure (not shown) and the shoulder bolts (not shown) passing through the front damping members 142. The vibrations are isolated by the damping members 142,156, and as the four damping members are identical the costs of production can be reduced.

The invention is not limited to the embodiments described herein which may be varied without departing from the spirit of the invention.

What is claimed is:

1. A mounting bracket for mounting an equipment housing to a rack, the mounting bracket comprising a bracket body for rigid attachment to the housing, a fastener for rigid attachment to the rack, and a damping member coupling the fastener to the bracket body.

2. A mounting bracket according to claim 1, wherein said damping member comprises an elastomeric material.

3. A mounting bracket according to claim 2, wherein said elastomeric material is a silicone.

4. A mounting bracket according to claim 3, wherein said elastomer is very high density silicone, having a modulus of 10–15 daN/cm$^2$.

5. A mounting bracket according to claim 1, comprising a plurality of said fasteners each coupled to said bracket body by a respective damping member.

6. A mounting bracket according to claim 1, wherein said bracket body comprises a plate for engagement with a side panel of said housing, said plate extending from a front edge to a rear edge and a flange, perpendicular to said plate and depending from said front edge, on which the damping member is located.

7. A mounting bracket according to claim 6, further comprising a rear mounting located adjacent said rear edge, said rear mounting comprising a rear fastener for rigid attachment to said rack, and a rear damping member coupling said rear fastener to said bracket body.

8. A mounting bracket according to claim 7, wherein said rear damping member comprises a solid cylinder of elastomeric material, and said bracket body and said fastener are coupled to the opposite faces of said cylinder.

9. A mounting bracket according to claim 8, wherein said rear damping member comprises a substantially cylindrical body of elastomeric material having an axial bore, and wherein one of said bracket body and said fastener is in coupling engagement with the bore and the other is in coupling engagement with the external surface of the cylinder.

10. A mounting bracket according to claim 1, wherein said damping member comprises a substantially cylindrical body of elastomeric material having an axial bore, and wherein one of said bracket body and said fastener is in coupling engagement with the bore and the other is in coupling engagement with the external surface of the cylinder.

11. A mounting bracket according to claim 10, wherein said fastener comprises a shoulder bolt having a head, a threaded section, and a shank defining a shoulder between the head and the threaded section, for engagement with a threaded hole in a surface of the rack, said bolt passing along the centre of said bore, whereby the damping member is compressed to a predetermined extent between the head of the bolt and said rack surface when the bolt is driven home such that the shoulder meets the surface.

12. A mounting bracket according to claim 1, further comprising an anchor mechanism for attachment of the bracket body to the housing.

13. A mounting bracket according to claim 12, wherein said anchor mechanism comprises a hook provided on the bracket body for engagement with a lip on the housing.

14. A mounting bracket according to claim 13, wherein the bracket body comprises a pair of separable body members, each having one of said hooks for engagement with a respective lip on the housing, and wherein said hooks may be brought into anchoring engagement with said lips by connecting the body members together.

15. A mounting bracket according to claim 12, wherein said anchor mechanism is selected from a screw, a bolt, a rivet and a weld.

16. A mounting bracket according to claim 1, further comprising a subsidiary bracket, connected to the bracket body, for mounting an associated equipment housing to said rack, whereby under vibrational stress said equipment housing and said associated equipment housing move as a single unit.

17. A mounting bracket according to claim 16, wherein said subsidiary bracket comprises a subsidiary bracket body for rigid attachment to said associated equipment housing, a fastener for rigid attachment to said rack, and a damping member coupling said fastener to said subsidiary bracket body.

18. A mounting bracket according to claim 1, wherein said damping member strongly absorbs frequencies of less than about 20 Hz.

19. A mounting bracket according to claim 1, wherein said damping member in its relaxed state has a natural frequency of from about 20 Hz to about 60 Hz.

20. A mounting bracket according to claim 19, wherein said damping member in its relaxed state has a natural frequency of from about 30 Hz to about 40 Hz.

21. A mounting bracket according to claim 1, wherein said damping member in its compressed state, in use, has a natural frequency of from about 35 Hz to about 45 Hz.

22. A mounting bracket according to claim 21, wherein said damping member in its compressed state, in use, has a natural frequency of about 40 Hz.

23. An equipment housing comprising a pair of opposed sidewalls connected by top and bottom walls and a rear wall, to define a box-like structure having an open front, each of said sidewalls having rigidly attached thereto a bracket body of a mounting bracket, said mounting bracket further comprising a fastener for rigid attachment to a rack, and a damping member coupling said fastener to said bracket body.

24. An equipment housing according to claim 23, wherein said damping member is provided on a flange extending away from said bracket body in a plane substantially coincident with that of the open front.

25. An equipment housing according to claim 24, wherein said bracket body further comprises a rear mounting located on said bracket body adjacent said rear wall, said rear mounting comprising a rear fastener for rigid attachment to said rack, and a rear damping member coupling said rear fastener to said bracket body.

26. A rack for mounting equipment housings, the rack comprising a base, a pair of opposed elongate parallel side members projecting from the base and terminating in free ends, and a top member coupling said free ends, wherein each of said side members has a pair of spaced apart parallel rails extending substantially along the length of the side members, said parallel rails each having a series of mounting points distributed along the length of the rail, whereby each side member may accommodate front and rear sets of fasteners for equipment mounting brackets, and including an equipment housing mounted between said side members, said housing having a pair of opposed sidewalls connected by top and bottom walls and a rear wall, to define a box-like structure having an open front, each of said sidewalls having rigidly attached thereto a bracket body of a mounting bracket, each of said mounting brackets further comprising a front and a rear fastener, wherein said front fastener is provided on a flange extending away from said bracket body in a plane substantially coincident with that of the open front, such that the front fastener of either bracket is fastened to one of said rails in the adjacent side member, and wherein said rear fastener is located adjacent said rear wall of said housing and is fastened to the other of said rails of each side member.

27. A rack according to claim 26, wherein said fasteners are coupled to said bracket body by damping members having a vibrational absorption profile with a maximum response at a frequency approximately equal to a resonant frequency of the rack.

28. A mounting bracket for mounting an equipment housing to a rack, the mounting bracket comprising a bracket body for rigid attachment to said housing, and a fastener for rigid attachment to said rack, wherein the bracket body comprises a pair of separable body members, each having a hook for engagement with a respective lip on an equipment housing, such that said hooks may be brought into anchoring engagement with said lips by connecting the body members together.

29. A method of mounting a bracket to an equipment housing, said bracket comprising a pair of separable body members, each having a hook for engagement with a respective lip on said equipment housing, comprising the steps of engaging each of said hooks with a respective lip, and connecting the body members to one another when the hooks are engaged to anchor the bracket to the housing.

30. A method of mounting an equipment housing to a rack by means of a pair of brackets on opposite sides of the housing, each bracket having a front and a rear fastener, comprising placing the housing into the rack between a pair of rack side members such that said front fasteners are in registering alignment with a respective mounting point on a front rack rail of each side member and said rear fasteners are in registering alignment with a respective mounting point on a rear rack rail of each side member, and fastening the fasteners to the mounting points.

31. A rack for mounting one or more equipment housings, the rack comprising a base, a pair of opposed elongate parallel side members projecting from the base and terminating in free ends, and a top member coupling said free ends, wherein each of said side members has a pair of spaced apart parallel rails extending substantially along the length of the side members, said parallel rails each having a series of mounting points distributed along the length of the rail, whereby each side member may accommodate front and rear sets of fasteners for equipment mounting brackets, and in which each equipment housing comprises a pair of opposed sidewalls connected by top and bottom walls and a rear wall, to define a box-like structure having an open front, each of said sidewalls having rigidly attached thereto a bracket body of a mounting bracket, said mounting bracket further comprising a fastener for rigid attachment to said rack, and a damping member coupling said fastener to said bracket body.

* * * * *